(12) United States Patent
Waitl et al.

(10) Patent No.: US 6,683,325 B2
(45) Date of Patent: Jan. 27, 2004

(54) THERMAL EXPANSION COMPENSATED OPTO-ELECTRONIC SEMICONDUCTOR ELEMENT, PARTICULARLY ULTRAVIOLET (UV) LIGHT EMITTING DIODE, AND METHOD OF ITS MANUFACTURE

(75) Inventors: Guenter Waitl, Regensburg (DE); Alfred Langer, Kissing (DE); Reinhard Weitzel, Maisach (DE)

(73) Assignees: Patent-Treuhand-Gesellschaft-für Elektrische Glühlampen mbH, Munich (DE); Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/218,887

(22) Filed: Aug. 14, 2002

(65) Prior Publication Data

US 2003/0107046 A1 Jun. 12, 2003

Related U.S. Application Data

(63) Continuation-in-part of application No. 09/237,778, filed on Jan. 26, 1999.

(51) Int. Cl.$^7$ .............................................. H01L 29/267
(52) U.S. Cl. ........................... 257/81; 257/99; 257/100; 257/98
(58) Field of Search ............................. 257/79, 80, 81, 257/98, 99, 100; 438/22, 25, 26, 27, 29

(56) References Cited

U.S. PATENT DOCUMENTS

| | | | |
|---|---|---|---|
| 3,938,177 A | | 2/1976 | Hansen et al. .................. 357/72 |
| 4,752,521 A | * | 6/1988 | Smith et al. .................. 428/209 |
| 5,391,523 A | | 2/1995 | Marlor |
| 5,606,218 A | | 2/1997 | Cotter et al. |
| 5,925,898 A | * | 7/1999 | Spath .......................... 257/98 |
| 5,945,732 A | * | 8/1999 | Burns .......................... 257/674 |
| 5,966,393 A | * | 10/1999 | Hide et al. ..................... 372/23 |
| 5,981,945 A | * | 11/1999 | Spaeth et al. .................. 250/239 |
| 6,365,920 B1 | * | 4/2002 | Abramov et al. ............... 257/81 |
| 6,459,130 B1 | * | 10/2002 | Arndt et al. ................... 257/432 |
| 2001/0002049 A1 | * | 5/2001 | Reeh et al. .................... 257/103 |

FOREIGN PATENT DOCUMENTS

| | | |
|---|---|---|
| DE | 195 47 567 | 7/1996 |
| EP | 0 603 933 | 6/1994 |
| WO | WO/97/12404 | 4/1997 |

OTHER PUBLICATIONS

"White-light diodes are set to tumble in price" by Philip Hill, OLE, pp. 17–20, Oct. 1997.
"Reliability Behavior of GaN-based Light Emitting Diodes" by Daniel Steigerwald, Proceedings of the 2nd Int'l Conf. On Nitride Semiconductors, Oct. 27–31, 1997, pp. 514–515.
"High Power UV InGaN/AlGaN Double Heterostructure LED's" by Mukai et al., Dept. of Research & Dev., Nichia Chemical Indus., Ltd., Japan.

* cited by examiner

Primary Examiner—Wael Fahmy
Assistant Examiner—Nathan W. Ha
(74) Attorney, Agent, or Firm—Cohen, Pontani, Lieberman & Pavane

(57) ABSTRACT

An opto-electronic semiconductor element has a radiation emitting or receiving, that is, radiation active semiconductor chip secured to an electrically conductive base frame. One, or a plurality of chips, are surrounded by a housing which may be integral with or have, separately, a cover. All materials of the housing, as well as of the conductive base frame, have mutually matching thermal coefficients of expansion within the temperature ranges which arise during manufacture and in application of the semiconductive element, singly or as a plurality in a common housing. Glass, quartz glass, ceramic or glass ceramic are suitable for the housing or parts thereof; the conductive base frame is preferably made of cladded or jacketed copper wire or strip with an iron-nickel core. Assembling a plurality of chips in a housing which has a luminescence conversion layer, e.g. a phosphor applied thereto, permits construction of a flat light source.

24 Claims, 3 Drawing Sheets

THERMAL EXPANSION COMPENSATED OPTO-ELECTRONIC SEMICONDUCTOR ELEMENT, PARTICULARLY ULTRAVIOLET (UV) LIGHT EMITTING DIODE, AND METHOD OF ITS MANUFACTURE

This application is a Continuation-in-Part of U.S. patent application Ser. No. 09/237,778 filed Jan. 26, 1999.

Reference to related U.S. patents and application, the disclosures of which are hereby incorporated by reference:
U.S. Pat. No. 5,391,523, Marlor;
U.S. Pat. No. 5,606,218, Cotter et al.;
Published PCT application PCT/DE96/01728 (U.S. designated)

Reference to related patents and publications:
European published application A 603 933, published Jun. 29, 1994, Filmer;
German published application DE 195 47 567 A1, Varga et al.;
"White-light diodes are set to tumble in price", by Philip Hill, OLE, pp. 17 to 20, October 1997;
Proceedings of the Second International Conference on Nitride Semiconductors, ICNS'97, articles by D. Steigerwald: "Reliability Behavior of GaN-based Light Emitting Diodes", p. 514–515; and
"High Power UV InGaN/AlGaN Double Heterostructure LEDs", by Mukai, Morita and Nakamura, p. 516.

FIELD OF THE INVENTION

The present invention relates to opto-electronic semiconductor elements, particularly suitable for general illumination, and especially adapted to be used with luminescence or light wavelengths conversion phosphors, in which the respective components of the semiconductor element, when integrated to form a light source, are so constructed that thermal coefficients of expansion of the respective elements are similar, and to a method of manufacturing such elements. The light emitting elements are, for example, light emitting diodes (LEDs), which emit light in the region of between about 320 to 1600 nm. Preferably, the LEDs emit ultraviolet (UV) light, and are used in combination with luminescence conversion materials to emit white or other visible light. These elements can then be used for general illumination purposes. It is also possible to use the elements to emit UV radiation, without luminescence conversion. The semiconductors usually utilize a nitride of gallium, and/or indium and/or aluminum.

BACKGROUND OF THE INVENTION

Opto-electronic semiconductors, for example LEDs, are restricted in their possibility of application. Up to now, these restrictions have not been considered serious. Plastics are thought as ideal housings for the semiconductors, since they can be easily worked, or cast. Resin casting technology, using epoxides, is widely employed. The apparently ideal suitability plastics as a material for the housings cover a defect, however, namely the mismatch of the expansion behavior of the respective elements, upon changes in temperature. Using the customary plastic housing limits the temperatures arising in manufacture and/or operation to the region of from −55° C. to +110° C. When used with very short wavelengths, in the UV range, the housing degrades rapidly.

Light-emitting diodes, providing white light, have recently been considered for general illumination purposes. The LED itself emits blue, or UV light, from which white light is generated. General illumination structures are customarily based on radial arrangements, suitable for insertion mounting. Luminescent conversion by LEDs, also known as LUCOLED designs, are typical. Surface mount structures are also used, particularly for TOPLED designs for surface mount LEDs. The article "White-light diodes are set to tumble in price" by Philip Hill, OLE, October 1997, pp. 17 to 20, describes details of such structures. The LUCOLED design, for example, utilizes blue emitters based on GaN, from which, by luminescence conversion, white light is generated.

The article "High Power UV InGaN/AlGaN Double Heterostructure LEDs" by Mukai, Morita and Nakamura, describes the construction of a UV-emitting LED with an emitting wavelength of about 370 nm. The LED has a chip secured to a circuit support frame, and cast in a plastic housing.

LEDs of different colors are investigated and described in the article "Reliability Behavior of GaN-based Light Emitting Diodes" by D. Steigerwald. This article, as the one referred to above by Mukai et al., is published in the "Proceedings of the Second International Conference on Nitride Semiconductors"—ICNS' 97, pp. 514–515 and p. 516, respectively. It was determined that the degradation of the LED substantially increases with shorter emission wavelength down to about 470 nm. The determinative portions of the degradation are the factors of operating current and surrounding temperature, as well as the housing of plastic material. For the investigation, the epoxy resin housing was temporarily removed.

Overall, it appears that operating a UV-emitting LED will not lead to success, since the UV radiation damages the housing. If a blue emitting LED is used as a light source, the emitted light, and efficiency is relatively low, about 5 lm/W. Earlier opto-electronic semiconductor elements had a housing formed of a metal-glass system. A glass lens was fitted into a metal cap—see, for example, published PCT publication PCT/DE96/01728. This solution met higher requirements relating to the optical characteristics; manufacturing costs, however, for a base plate and for the lens cap are very high, overall manufacture is expensive, and high tolerances during manufacture and adjustment permit only limited use of such technology. Optical perfection of the system, thus, is not suitable for many applications.

SUMMARY OF THE INVENTION

It is an object to provide an opto-electronic semiconductor element, and a method for its manufacture, which permits manufacture and/or use in a wide range regarding temperature and ambient humidity, and is suitable for operation in a wavelength region of between 300 nm to 1600 nm, and which is simple to manufacture.

Briefly, the semiconductor element has a semiconductor body which can receive, or emit, radiation. Since the semiconductor body can receive or emit radiation, the term "radiation active" will be used herein to cover both the reception, as well as emission, of radiation. This radiation active semiconductor is secured to an electrically conductive base frame, and is surrounded by a gas-tight housing. In accordance with a feature of the invention, all materials used for the housing and the base frame have temperature coefficients of expansion, within the temperature range which arises in manufacture and use, which are matched to each other.

Preferably, the housing has a base body with a recess, in which the base body is secured to the base frame in gas-tight manner. The semiconductor is a semiconductor chip, secured in the recess of the base frame, and the recess is closed off gas-tightly by a cover. In accordance with a feature of the invention, the base body and/or the cover is made of glass or quartz glass, or a ceramic, or a glass-ceramic. The respective materials are optimally matched to each other in the temperature range of from −60° C. to 150° C. This permits a junction temperature $T_1$ of, at this time, about 100° C. to 130° C., and even higher. Use of LEDs in an outside region up to a surrounding temperature of about 100° C. becomes possible, so that it is useful in automotive applications or in out-of-door information systems.

The semiconductor element in accordance with the present invention has the advantage that conventional methods can be used to attach the semiconductor chip on the conducive frame under high temperature conditions. The plastic housings used heretofore do not permit such attachment, due to the temperature sensitivity of the plastics. In accordance with a feature of the present invention, conductive adhesives which, for example, contain silver, are used.

The element in accordance with the present invention has another advantage, namely that the stability is enhanced, since boundary layer effects between the semiconductor chip and plastic housings are avoided. No delamination arises in long-term operation, nor during soldering. Thus, the light output coupling is stabilized.

Practice of the present invention has the particular advantage that, first and basically, the possibility is offered to provide a UV-emitting LED which has high light output and efficiency while, at the same time, the element can be inexpensively made. This is not only due to the basically simple concept of manufacture, but also due to the materials which are used, and which have a high transparency in the UV range and resistance against UV degradation, for example quartz glass. Plastics cannot meet these requirements, in practice.

The structure is so arranged that no mechanical tension or pressure stresses are applied on the semiconductor chip; consequently, no degradation due to stresses or strains will occur.

Plastics used conventionally tend to yellow, due to the effects of temperature and UV radiation. This causes a decrease in light output within the visible spectrum. Since, in accordance with the present invention, plastics are not used where light is emitted, the structure is not subject to such degradation.

The conductive base frame, preferably, is made of well-known copper cladded metal wire, or a material with similar behavior regarding thermal expansion, for example nickel-iron alloys. "copper cladded wire", as used herein, refers to a material having, for example, a core of a nickel-iron alloy and a cladding or jacket of copper.

Usually, the housing is made of several parts which are assembled together, the various parts being gas-tightly connected. Such gas-tight connection can, especially, be obtained by direct melting together or by adhesives. Organic or inorganic adhesives, for example, waterglass, are particularly suitable.

The cover on the frame portion is applied either as a wide surface over the surface of the frame itself, including the recess; alternatively, it can be applied only over the region of the recess.

The material for the housing, preferably, is low-melting glass, preferably soft glass, and especially leaded glass or alkali glass. It, typically, worked at a temperature from about 400° C. The thermal coefficient of expansion is at approximately 8 to $11 \times 10^{-6}$/K. The difference between the thermal coefficient of expansion of the various portions of the housing should not be greater than ±15%. The above-referred components are well-matched to each other within that range, for example when the base frame, or the metal leads, respectively, use melt-in alloys based on nickel-iron as main proportions, to which chromium and/or cobalt is added. Such alloys are known under the trade names VACO-VIT or VACON or VACODIL. These alloys can also be used for ceramics.

The cover may have suitable optical properties, and can be formed in various ways, for example as a fresnel optic, a bi-focal lens, a plan convex lens or a plan concave lens.

The inside of the frame part and/or the inside of the bottom part may have a reflective layer applied thereto. This may be an oxide layer or a metallic layer, or both. $TiO_2$, gold, silver, or aluminum are suitable.

The base body may be a single element, for example a pressed glass element, in which the base frame is embedded. The cap can be entirely transparent or partially transparent, formed with a light-emitting window, which may have a specific optical element therein, for example a lens, or a filter. The semiconductor chip, in accordance with a feature of the invention, emits radiation in the UV range, for example, and preferably in the range of 320 to 400 nm.

The opto-electronic element in accordance with the present invention can be made in various ways. For example, a pre-punched conductive ribbon can be covered with parts of pressed glass or sintered glass, which are then adhered together. Alternatively, a glass blank, or a glass rod is cut into individual pieces, which are brought in contact with the conductive frame, heated, and then shaped in a press form. This permits embedding the base frame directly in the housing. The individual parts of the housing are then melt-connected together.

A base/cap construction can also be made as a single element. Usually, it is easier to use two elements in the overall structure, which are then melt-connected together or adhered together, for example with a silicone adhesive.

The concept in accordance with the present invention is especially suitable for elements intended as replacements for incandescent lamps, utilizing LEDs. A flat panel light source can be conceived, which is constructed of a plurality of LEDs, operating as single pixels of an array, composed of a plurality of rows and columns. Preferably, the individual pixels are electronically controlled individually. The flat panel, thus, can function not only as a light source but, at least in part, for example a specific row and/or column of the array, as an information medium, in which the individual LEDs are controlled to form a pictogram, an icon or the like. In another form, a light source can be made which is ball shaped or at least approximately ball shaped, with an inner connecting rod. Individual luminescent pixels can be grouped around the rod.

A flat panel lamp, for general illumination, can, for example, be made in this manner: a plurality of base elements, forming individual pixels to then form the entire lamp are assembled together, are fully manufactured, or partially manufactured, but without a cover, that is, without a lens. They are applied to a substrate and electrically interconnected in a suitable network. They are then surrounded by a common housing and/or cover. Luminescence conversion can be obtained by the common cover. This results in a very thin, flat structure. The surface of the substrate can be shaped as desired, for example as a flat plane, a ball or essentially curved body, or a round rod. The basic element is a semiconductor, and thus the required control electronics can be integrated with the substrate, applied for example, by screen printing or surface mount technology (SMT). Dimming over a wide range is also possible.

Flat panel lamps can be made by forming multi-chip housings, in accordance with the present invention, by direct mounting of chips in such multi-chip housings. Modules can also be used, which generate white light by three individual components, red, green and blue. A controlled, stepless adjustment of color temperature is thus possible. For example, a basic structure providing white light can be used, in which further individual components emitting red, or blue portions used to lower, or raise, the color temperature are mixed into the white light, of the overall illumination provided.

BRIEF DESCRIPTION OF THE DRAWINGS

FIGS. 1a and 1b collectively illustrate an embodiment of a semiconductor element, in which FIG. 1a is a vertical sectional view of the semiconductor element, and FIG. 1b is a top view of the semiconductor element (the cover and housing being transparent);

DETAILED DESCRIPTION

Figure 1A:
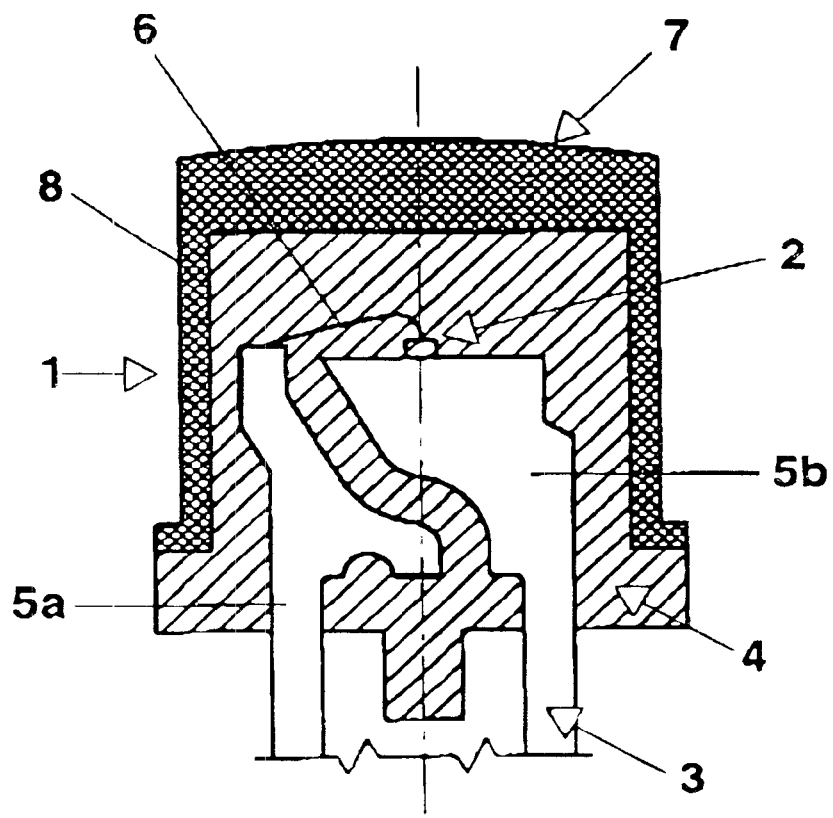
Figure 1B:
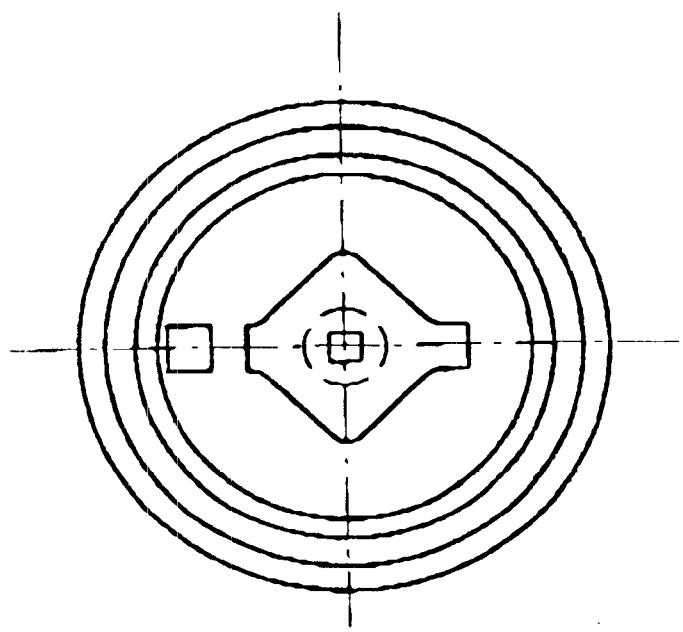

Referring to FIG. 1, collectively: a light emitting diode (LED) 1 is shown in FIG. 1a in vertical cross-section. A semiconductor chip 2 is secured to a conductive frame 3. Chip 2 is electrically conductively connected with two electrode connections 5a, 5b (collectively electrode connections 5), which pass through a bottom part 4 and form portions of the frame 3. A contact wire 6, also known as a bonding wire, effects connection of a chip 2 with the electrode connection 5a. The electrode connection 5b is effected by a bonding connection of the electrically conductive bottom side of the chip with the carrier surface which is unitary with the electrode connection 5b. For optical viewing of radiation emitted by the chip, a lens 7 is provided formed as the upper cover of a hollow, cylindrical cap 8. The cap 8 surrounds a substantial portion of the bottom part 4.

The bottom part 4, as well as the cap 8, are made of glass, for example, of lead glass. The lead glass has this composition (all percentages by weight): $SiO_2$ 60–65 wt %; PbO 20–22 wt. %; $K_2O$ 4–10 wt. %; $Na_2O$ 4–7 wt. %. Another lead glass which is also suitable has the following composition (all percentages by weight): $SiO_2$ 46–50 wt %; PbO 37–42 wt. %; $K_2O$ 0.5–5 wt. %; $Na_2O$ 7–13 wt. %; $Al_2O_3$ 0–2 wt. %. Still another lead glass which is also suitable has the same composition as the one described just previously except that it uses $B_2O_3$ in an amount of 0–10 wt. % instead of $Al_2O_3$ 0–2 wt. %.

The lead glass may be replaced by lead-free glass, for example as described in the referenced U.S. Pat. No. 5,391, 523, Marlor, the referenced application Ser. No. 08/410,440, filed Mar. 24, 1995, Cotter et al., European 603 933A and German 195 47 567A. Suitable connections and through leads can be constructed as well known in the semiconductor art, and for example as described in the aforementioned patents and applications.

Figure 2A:
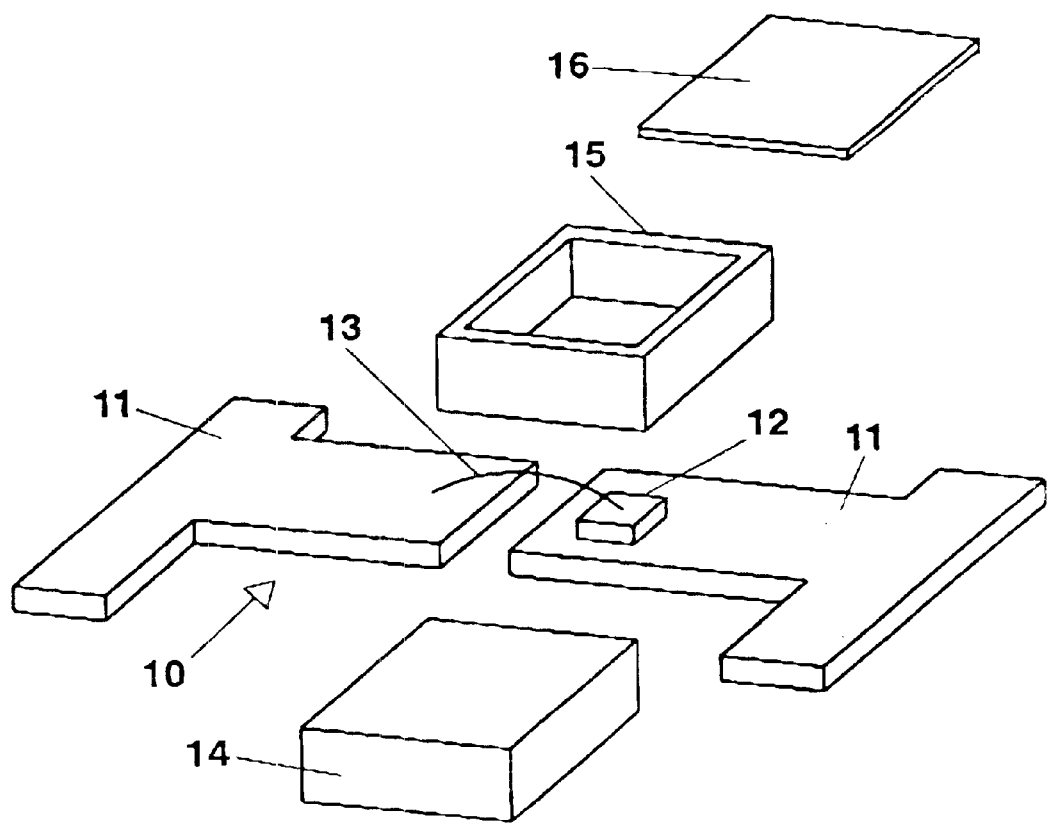
FIG. 2a is a perspective exploded view of a semiconductor element, also suitable to illustrate assembly.

FIG. 2a illustrates another embodiment, utilizing an LED in TOPLED arrangement. The conductive frame 10 is formed by two metallic strips 11. One of them has the semiconductor chip 12 attached thereto, as well known. A bonding or connecting wire 13 connects chip 12 with the second band or tape 11 of the conductive frame 10. The housing is formed by an essentially block-shaped bottom part 14, which is secured at the bottom of the frame 10. A rectangular, essentially square frame part 15 is secured to the top of the frame 10 and surrounds the chip 12. In addition, a cover 16 is required, which closes off the essentially rectangular surrounding part 15. Preferably, the cover 16 has optical properties. The cover 16 is not needed if the LED is formed as a single element, or pixel, of a flat surface luminaire or light source.

Figure 2B:
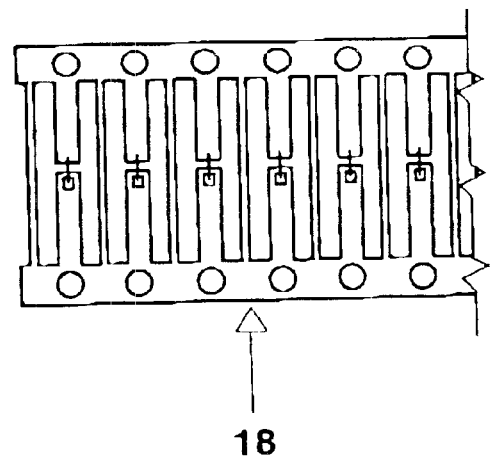
FIG. 2b is a top view of a conductive strip, suitable, for example, to assemble a plurality of elements.

FIG. 2b shows a ribbon 18 to form the chip carrier, for manufacture of an opto-electronic semiconductor elements, in top view.

Figure 3:
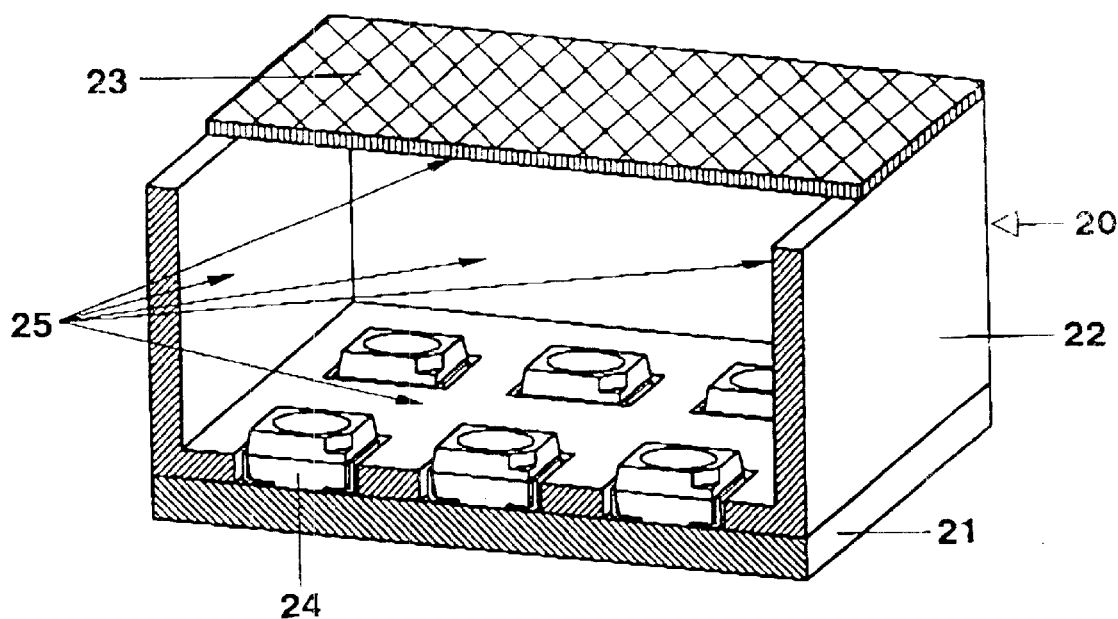
FIG. 3 is a perspective, partly cut-away view of a flat panel light, not to scale and greatly enlarged for ease of illustration, utilizing a plurality of semiconductor elements.

FIG. 3 is a perspective view, partly cut away, so that the interior of a flat luminaire or light source 20 will be visible. The light source 20 has a common carrier 21, on which an essentially block-shaped housing 22 is secured by an adhesive. The upper side of the housing is covered by a common cover 23. The essentially block-shaped housing 22 is formed with recesses, in which individual semiconductor elements 24 are located. The semiconductor elements 24 are UV-emitting LEDs. Conversion into visible light, for example white light, is effected by light conversion layers 25, which are attached to all surfaces subject to UV radiation from the LEDs. This includes the inner surfaces of the sidewalls of the housing 22, the bottom of the housing 22, and the cover 23. The individual semiconductor elements 24, forming individual pixels, may be constructed as illustrated in FIG. 2, or similar thereto.

Figure 4:
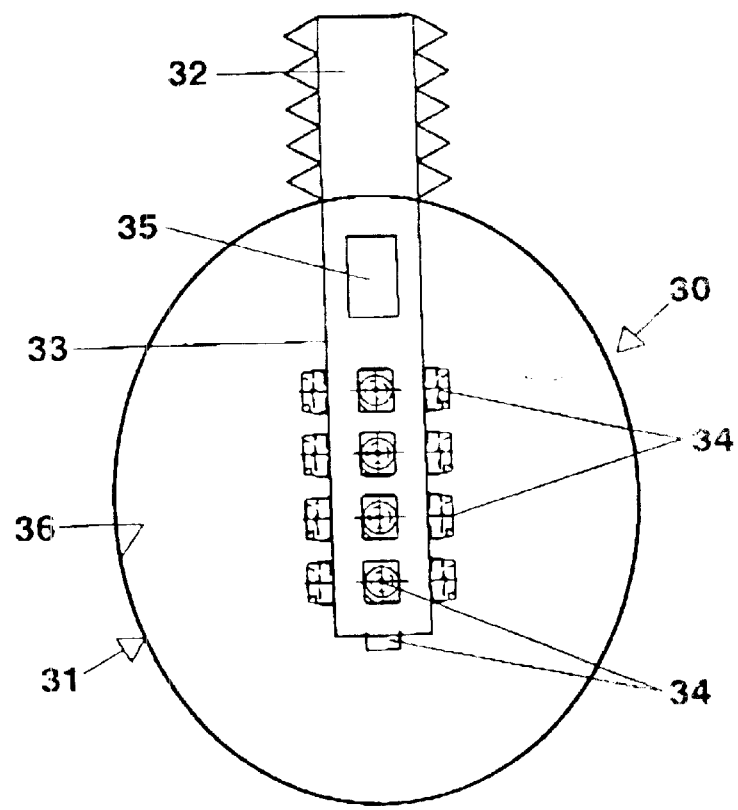
FIG. 4 is an example of a lamp, not to scale and partially expanded for ease of illustration, utilizing the semiconductor elements of the present invention.

FIG. 4 shows a compact lamp 30, utilizing LEDs. It is externally similar to well-known lamps, and has a ball-shaped or bulbous outer bulb 31, secured to a well-known screw base 32. The base 32 supports a round rod 33, which extends for a substantial distance in the interior of the outer bulb 31. The rod 33 is supplied with LEDs 34 at its upper surface. The interior of the rod 33 retains an electronic control unit 35. The outer bulb 31 is covered at its inner surface with a luminescence conversion layer 36. The LEDs 34 may emit, for example, UV, or blue light. The general principle is well known and reference is made, for example, to the referenced article in OLE of October 1997 by Philip Hill. The electronics 35 are standard components to energize and control the LEDs in the elements 24.

Various changes and modifications may be made and any features described herein with respect to any one of the embodiments may be used with any of the others, within the scope of the inventive concept.

What is claimed is:

1. Opto-electronic semiconductor element comprising
   an electrically conductive base frame;
   a semiconductor chip which emits radiation within the range of 320 to 400 nm and which is secured to said electrically conductive base frame;
   a housing fully surrounding the chip;
   said electrically conductive base frame extending from the housing;

wherein the housing is made from at least one of glass, quartz glass, ceramic and glass ceramic, at least a portion of said housing being transmissive to ultraviolet light;

wherein all materials of the housing and of the electrically conductive base frame have mutually matching thermal coefficients of expansion within a temperature range, which arises during manufacture and during use of said element, so that the base frame is gas-tightly connected to the housing;

wherein a difference among respective thermal coefficients of expansion of various portions of the housing and the base frame being not greater than ±15% relative to a predetermined thermal coefficient of expansion, wherein said electrically conductive base frame comprises a wire having a core of a nickel-iron alloy and a cladding of copper, and wherein said core of said wire includes at least one of chromium and cobalt.

2. The opto-electronic semiconductor element of claim 1, wherein said housing comprises a composite structure assembled of individual parts, and said individual parts are joined together in gas-tight manner, optionally jointed by an adhesive.

3. The opto-electronic semiconductor element of claim 1, wherein the housing includes a base body formed with at least one recess;

the base body being gas-tightly connected to said base frame;

said semiconductor chip being secured in the recess of the base body; and wherein the recess is gas-tightly closed off by a cover part.

4. The opto-electronic semiconductor element of claim 3, wherein the base body comprises at least one of glass, quartz glass, ceramic and glass ceramic.

5. The opto-electronic semiconductor element of claim 3, wherein said cover part comprises at least one of glass, quartz glass, ceramic and glass ceramic.

6. The opto-electronic semiconductor element of claim 1, wherein the housing comprises a bottom part and a frame part, said frame part surrounding said Semiconductor chip;

wherein the electrically conductive base frame is located between the bottom part and the frame part and wherein all said parts and said electrically conductive base frame are gas-tightly connected together.

7. The opto-electronic semiconductor element of claim 6, wherein a cover part is seated on the frame part.

8. The opto-electronic semiconductor element of claim 7, wherein said cover element has optical properties or characteristics, and comprises one of a fresnel optic, a bi-focal lens, a plan convex lens, a plan concave lens and a filter.

9. The opto-electronic semiconductor element of claim 6, wherein the inside of the frame part and/or the inside of the bottom part is formed with a reflective layer, and wherein said reflective layer comprises a metallic or oxide layer.

10. The opto-electronic semiconductor element of claim 9, wherein said reflective layer comprises at least one of silver, aluminum, gold and $TiO_2$.

11. The opto-electronic semiconductor element of claim 3, wherein said base body is a single unitary element formed of pressed glass;

wherein said electrically conductive base frame is embedded in the base body.

12. The opto-electronic semiconductor element of claim 1, wherein the housing comprises a cap element and a bottom part with a base body and with at least two electrically and thermally conductive metal through-leads;

the semiconductor chip being secured to one of the electrically conductive through-leads;

the cap element being gas-tightly secured to said base body; and wherein said base and said cap clement comprise at least one of glass, quartz glass, ceramic and glass ceramic.

13. The opto-electronic semiconductor element of claim 12, wherein said cap is a light exit window which includes an optical element comprising one of a lens or a filter.

14. Light source or lamp with at least one opto-electronic semiconductor element of claim 1, comprising a chip carrier with a carrier surface;

at least one opto-electronic semiconductor chip being secured to said carrier surface;

said housing including housing portions defining a base structure for said element;

an outer housing being associated with the chip carrier which housing may function as a base structure;

and wherein at least a portion of the outer housing comprises ultraviolet (UV) transparent or translucent material.

15. The opto-electronic semiconductor element of claim 3, wherein said cover element has optical properties or characteristics, optionally a fresnel optic, a bi-focal lens, a plan convex lens, a plan concave lens or a filter.

16. The opto-electronic semiconductor element as in claim 1, wherein said housing is one of leaded gloss and alkali glass.

17. The opto-electronic semiconductor element as in claim 16, wherein said housing has a thermal coefficient of expansion of approximately 8 to $11 \times 10^{-6}/K$.

18. The opto-electronic semiconductor element as in claim 1, wherein said housing has a thermal coefficient of expansion of approximately 8 to $11 \times 10^{-6}/K$.

19. Opto-electronic semiconductor element comprising an electrically conductive base frame;

a semiconductor chip which emits radiation within the range of 320 to 400 nm and which is secured to said electrically conductive base frame;

a housing fully surrounding the chip;

said electrically conductive base frame extending from the housing;

wherein the housing is made from at least one of glass, quartz glass, ceramic and glass ceramic, at least a portion of said housing being transmissive to ultraviolet light;

wherein all materials of the housing and of the electrically conductive base frame have mutually matching thermal coefficients of expansion within a temperature range, which arises during manufacture and during use of said element, so that the base frame is gas-tightly connected to the housing, wherein a difference among respective thermal coefficients of expansion of various portions of the housing and the base frame being not greater than ±15% relative to a predetermined thermal coefficient of expansion and wherein said glass contains 46–50 wt % $SiO_2$; 37–42 Wt % PbO; 0.5–5 wt % $K_2O$; 7–13 wt % $Na_2O$; and 0–2 wt % $Al_2O_3$.

20. The opto-electronic semiconductor element of claim 19, wherein said conductive base frame comprises a copper cladded or copper jacketed strip or wire, or a material having at least approximately the thermal expansion characteristics of copper-clad or copper-jacketed strip or wire.

21. Light source or lamp with at least one opto-electronic semiconductor element of claim 19, comprising a chip carrier with a carrier surface;

at least one opto-electronic semiconductor chip being secured to said carrier surface;

said housing including housing portions defining a base structure for said element;

an outer housing being associated with the chip carrier which housing may function as a base structure;

and wherein at least a portion of the outer housing comprises ultraviolet (UV) transparent or translucent material.

22. Opto-electronic semiconductor element comprising an electrically conductive base frame;

a semiconductor chip which emits radiation within the range of 320 to 400 nm and which is secured to said electrically conductive base frame;

a housing fully surrounding the chip;

said electrically conductive base frame extending from the housing;

wherein the housing is made from at least one of glass, quartz glass, ceramic and glass ceramic, at least a portion of said housing being transmissive to ultraviolet light;

wherein all materials of the housing and of the electrically conductive base frame have mutually matching thermal coefficients of expansion within a temperature range, which arises during manufacture and during use of said element, so that the base frame is gas-tightly connected to the housing, wherein a difference among respective thermal coefficients of expansion of various port on of the housing and the base frame being not greater than ±15% relative to a predetermined thermal coefficient expansion, and wherein said glass contains 46–50 wt % $SiO_2$; 37–42 wt % PbO; 0.5–5 wt % $K_2O$; 7–13 wt % $Na_2O$; and 0–10 wt % $B_2O_3$.

23. The opto-electronic semiconductor element of claim 22, wherein said conductive base frame comprises a copper cladded or copper jacketed strip or wire; or a material having at least approximately the thermal expansion characteristics of copper-clad or copper-jacketed strip or wire.

24. Light source or lamp with at least one opto-electronic semiconductor element of claim 22, comprising a chip carrier with a carrier surface;

at least one opto-electronic semiconductor chip being secured to said carrier surface;

said housing including housing portions defining a base structure for said element;

an outer housing being associated with the chip carrier which housing may function as a base structure;

and wherein at least a portion of the outer housing comprises ultraviolet (UV) transparent or translucent material.

* * * * *